(12) United States Patent
Horstmann et al.

(10) Patent No.: US 8,039,338 B2
(45) Date of Patent: Oct. 18, 2011

(54) METHOD FOR REDUCING DEFECTS OF GATE OF CMOS DEVICES DURING CLEANING PROCESSES BY MODIFYING A PARASITIC PN JUNCTION

(75) Inventors: Manfred Horstmann, Duerroehrsdorf-Dittersbach (DE); Peter Javorka, Radeburg (DE); Karsten Wieczorek, Dresden (DE); Kerstin Ruttloff, Hainichen (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 242 days.

(21) Appl. No.: 12/397,574

(22) Filed: Mar. 4, 2009

(65) Prior Publication Data
US 2009/0273036 A1 Nov. 5, 2009

(30) Foreign Application Priority Data
Apr. 30, 2008 (DE) .................. 10 2008 021 563

(51) Int. Cl.
*H01L 21/8238* (2006.01)
(52) U.S. Cl. .................. 438/220; 257/E21.642
(58) Field of Classification Search .................. None
See application file for complete search history.

(56) References Cited

U.S. PATENT DOCUMENTS

| | | | | |
|---|---|---|---|---|
| 5,147,499 A * | 9/1992 | Szwejkowski et al. | ....... | 438/704 |
| 5,550,079 A | 8/1996 | Lin | ................... | 437/56 |
| 5,885,861 A * | 3/1999 | Gardner et al. | ............... | 438/231 |
| 6,110,818 A * | 8/2000 | Haskell | .......................... | 438/621 |
| 6,342,438 B2 * | 1/2002 | Yu et al. | ......................... | 438/520 |
| 6,373,112 B1 | 4/2002 | Murthy et al. | ................ | 257/407 |
| 6,566,181 B2 * | 5/2003 | Bevk | .............................. | 438/199 |
| 7,303,952 B2 | 12/2007 | Adkisson et al. | ............. | 438/233 |
| 2002/0072182 A1 * | 6/2002 | Ha et al. | ........................ | 438/301 |
| 2004/0036119 A1 * | 2/2004 | Tang et al. | ..................... | 257/347 |
| 2005/0282386 A1 | 12/2005 | Yoshimura | .................... | 438/688 |
| 2006/0073689 A1 * | 4/2006 | Adkisson et al. | ............. | 438/585 |
| 2008/0157215 A1 * | 7/2008 | Miyashita | ..................... | 257/374 |

FOREIGN PATENT DOCUMENTS

| | | |
|---|---|---|
| DE | 19750340 A1 | 6/1999 |
| JP | 08031931 A | 2/1996 |

OTHER PUBLICATIONS

Translation of Official Communication from German Patent Office for German Patent Application No. 10 2008 021 563.5 dated Dec. 16, 2008.
"Surface Cleaning and Wet Processing Terminology," Contributions by Motorola Corporation, 1999 Arizona Board of Regents for The University of Arizona.
PCT Search Report and Written Opinion from PCT/US2009/002669 dated Jun. 26, 2009.
Translation of Official Communication from German Patent Office for German Patent Application No. 10 2008 021 563.5 dated Jun. 22, 2011.

\* cited by examiner

*Primary Examiner* — Benjamin Sandvik
(74) *Attorney, Agent, or Firm* — Williams, Morgan & Amerson, P.C.

(57) ABSTRACT

By incorporating nitrogen into the P-doped regions and N-doped regions of the gate electrode material prior to patterning the gate electrode structure, yield losses due to reactive wet chemical cleaning processes may be significantly reduced.

9 Claims, 11 Drawing Sheets

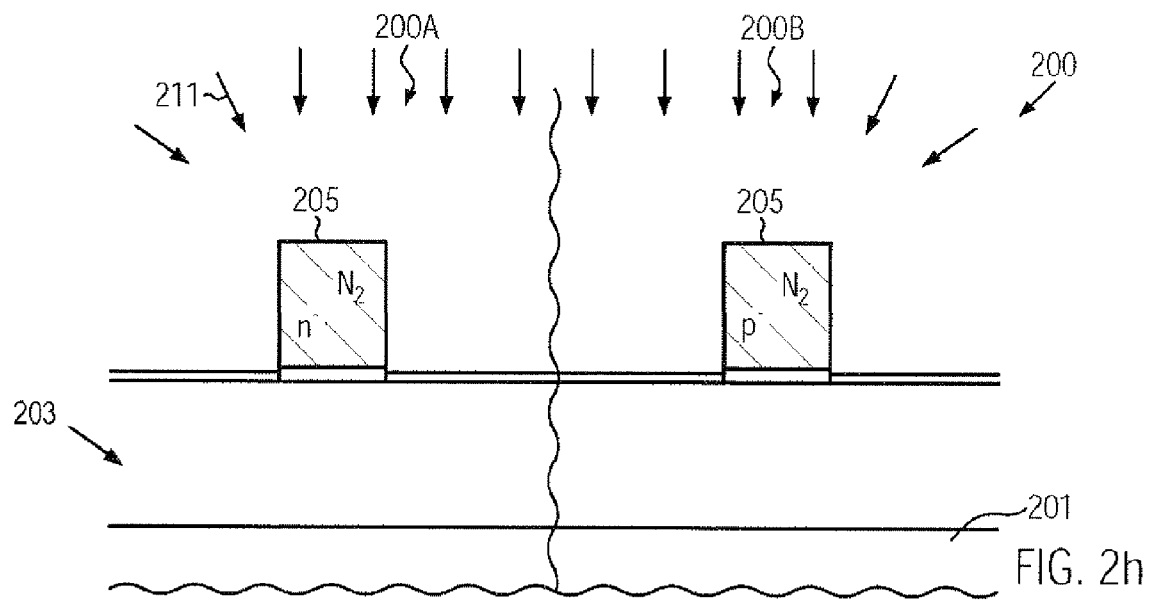
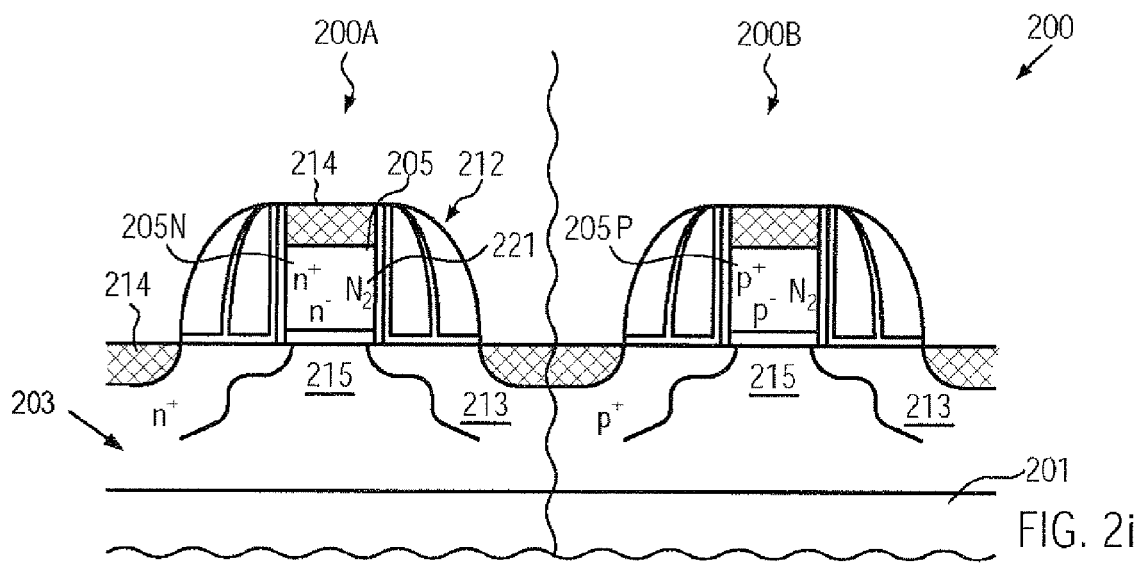

METHOD FOR REDUCING DEFECTS OF GATE OF CMOS DEVICES DURING CLEANING PROCESSES BY MODIFYING A PARASITIC PN JUNCTION

BACKGROUND

1. Field of the Disclosure

The present disclosure generally relates to the fabrication of integrated circuits, and, more particularly, to the manufacture of CMOS gate structures comprising a pre-doped gate material, such as a pre-doped polysilicon, with an improved uniformity of the dopant distribution.

2. Description of the Related Art

The fabrication of integrated circuits involves the formation of a very large number of circuit elements on a given chip area according to a specified circuit layout using a plurality of complex process steps. Generally, a plurality of process technologies are currently practiced, wherein, for logic circuitry, such as microprocessors, storage chips and the like, CMOS technology is currently one of the most promising approaches due to the superior characteristics in view of operational speed and/or power consumption and/or cost efficiency. In this technology, millions of complementary transistors, i.e., N-channel transistors and P-channel transistors, are formed on an appropriate substrate, wherein the ongoing demand for an improved circuit functionality from a given chip area or a reduction of chip area while maintaining circuit functionality necessitates the scaling of transistor dimensions.

MOS transistors are formed in and on semiconductor regions defined in a substrate by isolation structures, such as shallow trench isolations and the like. A typical MOS transistor comprises PN junction regions that are separated from each other by a channel region, the conductivity of which is controlled by a gate electrode formed above the channel region and separated therefrom by a thin insulating layer. The dimension of the channel region corresponding to the shortest distance between the two PN junction regions, which are also referred to as drain region and source region, is denoted as channel length and represents a dominant design characteristic of the MOS transistor. The channel width is the dimension of the channel in the substrate plane in the direction perpendicular to the length direction. The channel width is determined by the spacing between the isolation structures in this direction.

By reducing the channel length and width of the transistor, not only the transistor size but also the functional behavior thereof may be specifically designed so as to obtain a desired transistor performance. The channel length is associated with the gate length and may, in typical MOS transistors, be less than the gate length since the source and drain extension typically may extend below the gate electrode to a certain degree. Presently, a gate length of approximately 0.05 µm and less may be encountered in advanced CMOS devices.

Although the continuous size reduction of transistor elements has provided significant advantages in view of performance and/or power consumption, a plurality of issues has to be addressed so as to not unduly offset some of the advantages that are gained by the reduced dimensions of the circuit elements. For example, the fabrication of the circuit components having the critical dimensions, such as the gate electrode of the transistor element substantially determining the channel length, requires considerable efforts to reliably and reproducibly form these tiny circuit components. For instance, it is an extremely complex process to form gate electrodes having a gate length that is well below the wavelength of the UV radiation used to transfer a layout image from a reticle to a resist layer formed on the substrate.

A further difficulty arises from the fact that the PN junctions are defined by dopant profiles that are, at least partially, created by ion implantation and subsequent anneal cycles. Since, typically, reduced feature sizes necessitate higher dopant concentrations to compensate for the reduced conductivity owing to reduced cross-sectional areas, complex implantation cycles are required, wherein the vertical and lateral dopant profile has to be precisely controlled to achieve the desired transistor performance. Since the dopants implanted are subjected to diffusion upon elevated temperatures of the device during the further manufacturing processes, for activating the dopants and curing implantation-induced lattice damage, very strict requirements have to be met with respect to a thermal budget that describes the diffusivity of the dopants over time. The source/drain implantation is performed by using the gate electrode as an implantation mask, thereby providing an increased dopant level in the gate electrode, which is typically provided in the form of polysilicon.

A reduced transistor gate length also requires extremely shallow PN junctions in order to maintain the required controllability of the channel conductivity. Thus, the doping levels and profiles required in the drain and source regions of advanced transistor elements may necessitate implant processes that may be insufficient to achieve the required conductivity of the polysilicon gate electrode. Moreover, due to the non-uniform dopant distribution of these drain/source implantations, the resulting dopant concentration in the polysilicon gate electrode may not be appropriate for preventing undesired gate charge carrier depletion during transistor operation.

To overcome this problem, a polysilicon pre-doping process is typically performed after deposition of the polysilicon gate layer and prior to the gate patterning step. The polysilicon pre-doping is typically performed by ion implantation based on implantation parameters so as to substantially avoid penetration of dopants through the gate insulation layer, which otherwise may cause severe damage.

Consequently, the conventional approach may provide enhanced control of the electronic characteristics of the gate electrode structures of complex CMOS devices while, however, an increased degree of device failures may be observed after completion of the transistor structures, as will be described in more detail with reference to FIGS. 1a-1e.

FIG. 1a schematically illustrates a top view of a CMOS device, that is, a semiconductor device including field effect transistors of different conductivity type, that is, P-channel transistors and N-channel transistors. The device 100 may comprise a substrate (not shown in FIG. 1a), above which is formed a semiconductor layer 103, in which are defined respective active regions or transistor regions 100A, 100B by means of an isolation structure 102. For example, the region 100A may correspond to an N-channel transistor while the region 100B may correspond to a P-channel transistor. Furthermore, as indicated by the dashed line 105, a gate electrode is to be formed so as to extend above the regions 100A, 100B so that a respective gate electrode material has to be doped according to the conductivity type of the respective transistors 100A, 100B as explained above.

FIG. 1b schematically illustrates a cross-sectional view of the device 100 as indicated by the line Ib in FIG. 1a. As illustrated, in the manufacturing stage shown, the device 100 comprises a substrate 101, which may represent any appropriate carrier material for forming thereabove the semiconductor layer 103, which may typically be a silicon layer since the vast majority of complex CMOS devices is presently, and will be in the near future, made of silicon due to the superior availability and the well-understood characteristics thereof. The substrate 101 in combination with the semiconductor layer 103 may form a "bulk" configuration in which the semiconductor layer 103 may represent an upper portion of the substantially crystalline material of the substrate 101, while, in other cases, a silicon-on-insulator (SOI) configuration may be used in which a buried insulating layer (not shown) may be positioned between the substrate 101 and the semiconductor layer 103. Furthermore, a gate insulation layer 106A is formed on the semiconductor layer 103 and, depending on the process for forming the gate insulation layer 106A, i.e., deposition or oxidation, the layer may or may not be formed on the isolation structure 102. For example, the gate insulation layer 106A may typically be comprised of silicon dioxide with an appropriate thickness corresponding to the overall characteristics of the transistors 100A, 100B. Moreover, a polysilicon layer 105A is formed on the gate insulation layer 106A with an appropriate thickness as required for the further processing for forming the gate electrode 105. Furthermore, an implantation mask 107, such as a resist mask, is formed above the device 100 such that the transistor region 100B may be covered, while the transistor region 100A may be exposed to an ion bombardment 108 for introducing a desired dopant species, such as an N-type dopant species.

The semiconductor device 100 as shown in FIGS. 1a and 1b may be formed on the basis of the following conventional process techniques. After providing the substrate 101 having formed thereabove the semiconductor layer 103, depending on the overall device strategy, the isolation structure 102 may be formed, for instance, by well-established lithography techniques for providing an etch mask, followed by an etch process for forming respective trenches in the semiconductor layer 103 down to a desired depth. Thereafter, an appropriate insulating material, such as silicon dioxide, possibly in combination with silicon nitride, may be deposited in order to fill the respective trenches with an insulating material. Next, excess material may be removed, for instance by etching, chemical mechanical polishing (CMP) and the like, thereby also providing an enhanced surface topography for the subsequent process steps. It should be appreciated that, in advanced integrated circuits, minimum feature sizes have reached a deep sub-micron range, thereby also requiring significant efforts in terms of suppressing contamination of the device 100, although the number of process steps may have increased with increasing complexity of the semiconductor devices. For this reason, exposed surface portions of a semiconductor device may have to be subjected to efficient cleaning processes in order to remove contaminations, such as organic species, metallic species and the like, which may otherwise have a significant influence on the further processing of the device. For example, the complex etch recipes typically used in patterning advanced features, such as the isolation structures 102 and also subsequent structures, such as the gate electrode 105, and also steps such as CMP, may result in a significant surface contamination in the form of organic etch residues, defect particles and the like, thereby requiring efficient cleaning strategies for which a plurality of efficient wet chemical processes have been established. Thus, prior to the formation of the gate insulation layer 106A, a respective wet chemical cleaning process may be performed. Thereafter, the gate insulation layer 106A may be formed, for instance, by oxidation, possibly in combination with deposition, depending on the overall requirements. Thereafter, the polysilicon layer 105A may be formed, for instance by low pressure chemical vapor deposition (LPCVD) based on well-established deposition recipes. Next, the resist mask 107 may be formed by photolithography and the ion implantation process 108 may be performed on the basis of appropriately selected implantation parameters so as to introduce a moderate dopant concentration into the exposed portion of the polysilicon layer 105A down to a specified depth, which is typically selected such that significant penetration of the gate insulation layer 106A and the underlying silicon material may be avoided. It should be appreciated that, prior to or after forming the isolation structure 102, respective implantation sequences may be performed to define the required base doping in the respective transistors 100A, 100B. In the example shown, it may be assumed that the transistor 100A may receive a P-type dopant so as to form an N-channel transistor by defining highly N-doped drain and source regions in a later manufacturing stage. Similarly, the transistor 100B may have received an N-type dopant species in order to form a P-channel transistor by defining heavily P-doped drain and source regions in a later stage.

FIG. 1c schematically illustrates the device 100 in a further advanced manufacturing stage, in which an implantation mask 109 covers the region of the transistor 100A, while exposing the region of the transistor 100B during a further implantation process 110 for introducing a P-type dopant species into the exposed portion of the polysilicon layer 105A. Also, in this case, appropriately selected implantation parameters, such as energy and dose, may be selected so as to suppress undue penetration of the underlying gate insulation layer 106A and the semiconductor layer 103. After the implantation process 110, the implantation mask 109 may be removed and the further processing may be continued, for instance, by cleaning the resulting surface and depositing an anti-reflective coating (ARC) material, if required, followed by a mask material, such as resist and the like, for forming an appropriate etch mask for patterning the polysilicon layer 105A. For this purpose, well-established process techniques may be used. Thereafter, a sophisticated etch process may be performed by using plasma assisted and wet chemical etch techniques for patterning the polysilicon layer 105A, while using the gate insulation layer 106A as an etch stop material.

FIG. 1d schematically illustrates a cross-sectional view according to the line Id, as illustrated in FIG. 1a, after the etch process and after the removal of any unwanted materials, such as photoresist, any hard mask material and/or ARC material and the like. Thus, as illustrated, the transistor 100A comprises the gate electrode 105 with a gate length, i.e., in FIG. 1d, the horizontal extension of the gate electrode 105, in accordance with the design rules and the process variations occurring during the previously described patterning sequence. Furthermore, as previously explained, the plurality of the preceding process steps may require an additional cleaning process 111 in the form of a wet chemical step to efficiently remove contamination prior to performing subsequent process steps. For this purpose, a plurality of wet chemical solutions have been established, wherein, for instance, a mixture of ammonia ($Nh_3$) and hydrogen peroxide ($H_2O_2$) (APM) has proven to be a highly efficient cleaning agent. Thus, during the wet chemical cleaning process 111, APM may be supplied with a specific concentration and at a predefined temperature in order to efficiently remove any contaminants. However, although APM represents a highly efficient wet chemical cleaning agent, a reaction rate may significantly depend on the electrochemical conditions during the etch process, which may sensitively depend on the presence of any metal residues, wherein it has been observed that APM may initiate extensive etching of polysilicon material in the presence of even very low metallic surface contaminations. Consequently, depending on the degree of surface contamination by any metal residues, a more or less pronounced attack of the gate electrode 105 may occur during the wet chemical cleaning process 111. After the process 111, the further processing may be continued on the basis of well-established CMOS techniques.

FIG. 1e schematically illustrates the transistor 100A in an advanced manufacturing stage. As illustrated, the transistor 100A comprises a spacer structure 112 on sidewalls of the gate electrode 105, which has formed therein a metal silicide region 114. Respective metal silicide regions 114 may also be formed in drain and source regions 113, which laterally enclose a channel region. In the example shown, the transistor 100A represents an N-channel transistor so that the drain and source regions 113 as well as an upper portion of the gate electrode 105 may comprise a moderately high concentration of an N-dopant species, while a lower portion of the gate electrode 105, indicated as n⁻, may be doped with a concentration as provided by the implantation process 108 (FIG. 1b) in order to enhance the electrical characteristics of the gate electrode 105. Furthermore, as previously indicated, in some cases, a significant etch damage may be observed in the gate electrode 105, which is assumed to be caused by the wet chemical cleaning process 111 on the basis of APM, as previously discussed. Consequently, the damaged carrier 105B may significantly affect the overall characteristics of the gate electrode 105 and thus of the transistor 100A, which may lead to increased yield losses in sophisticated CMOS devices.

The present disclosure is directed to various methods and devices that may avoid, or at least reduce, the effects of one or more of the problems identified above.

SUMMARY OF THE DISCLOSURE

The following presents a simplified summary of the disclosure in order to provide a basic understanding of some aspects disclosed herein. This summary is not an exhaustive overview, and it is not intended to identify key or critical elements of the invention or to delineate the scope of the invention. Its sole purpose is to present some concepts in a simplified form as a prelude to the more detailed description that is discussed later.

Generally, the present disclosure relates to CMOS devices and techniques for manufacturing the same, in which yield losses caused by etch damage of gate electrode structures may be reduced by modifying a parasitic PN junction in gate electrode materials prior to performing sophisticated wet chemical cleaning processes, as may be required after the patterning of the gate electrode structure and prior to the further processing for completing the transistor structure. Without intending to restrict the present disclosure to the following explanation, it is assumed that the "electrostatic" charge distribution in the vicinity of the parasitic PN junction, which may be created in the semiconductor gate electrode material prior to the patterning thereof, may have a significant influence on the overall etch characteristics of sensitive wet chemical cleaning processes, in particular in the presence of even minute metallic surface contaminations. Hence, an appropriate modification of the respective parasitic PN junction may therefore result in reduced electrical fields and thus a less pronounced generation of charges within a significant portion of the semiconductor-based gate electrode material, thereby also reducing the degree of sensitivity with respect to metallic surface contaminations in a corresponding wet chemical cleaning process. The modification of the respective parasitic PN junction may, in some illustrative aspects disclosed herein, be accomplished on the basis of an additional implantation process for introducing an inert species, such as nitrogen, thereby reducing the creation of space charge, or even completely disrupting the respective PN junction. In other illustrative aspects disclosed herein, the characteristics of the parasitic PN junction may be adjusted such that significantly reduced electric field strings may occur, which may also result in a reduced creation of electrostatic charges. Consequently, a significant increase of yield may be accomplished during the formation of complex CMOS devices while not unduly contributing to the overall process complexity.

One illustrative method disclosed herein comprises implanting an inert species in a layer of a gate electrode material, which is formed above a substrate and has a P-doped layer portion and an N-doped layer portion. The method further comprises forming a first gate electrode from the P-doped layer portion and a second gate electrode from the N-doped portion. Additionally, the method comprises performing a wet chemical cleaning process and forming a first transistor on the basis of the first gate electrode and a second transistor on the basis of the second gate electrode.

A further illustrative method disclosed herein relates to forming a CMOS device. The method comprises forming a gate electrode material on a gate insulation layer and forming an N-doped region and a P-doped region in the gate electrode material. Moreover, a junction region between the N-doped region and the P-doped region is modified so as to reduce an electrostatic potential near the junction region. The method further comprises forming a first gate electrode from the N-doped region and a second gate electrode from the P-doped region and performing a wet chemical cleaning process on the first and second gate electrodes.

An illustrative CMOS device disclosed herein comprises a P-channel transistor comprising a first gate electrode, which comprises a first metal silicide region in contact with a first silicon-containing region, wherein the first metal silicide region comprises an inert species with a first concentration. The CMOS device further comprises an N-channel transistor comprising a second gate electrode, which comprises a second metal silicide region in contact with a second silicon-containing region, wherein the second metal silicide region comprises the inert species with a second concentration that is approximately equal to the first concentration.

BRIEF DESCRIPTION OF THE DRAWINGS

The disclosure may be understood by reference to the following description taken in conjunction with the accompanying drawings, in which like reference numerals identify like elements, and in which:

FIGS. 2h-2i schematically illustrate cross-sectional views along the lines as shown in FIG. 2g during further advanced manufacturing stages, according to illustrative embodiments;

Figure 1A:
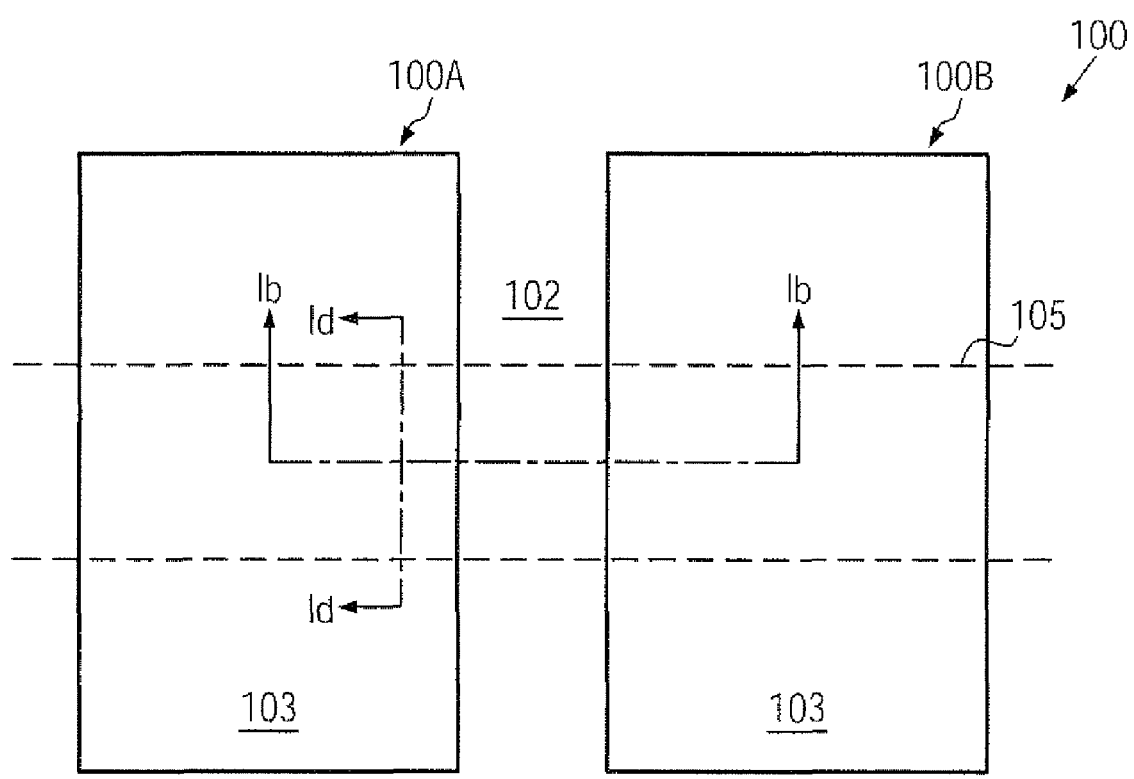
FIG. 1a schematically illustrates a top view of a CMOS device at an early manufacturing stage.
Figure 1B:
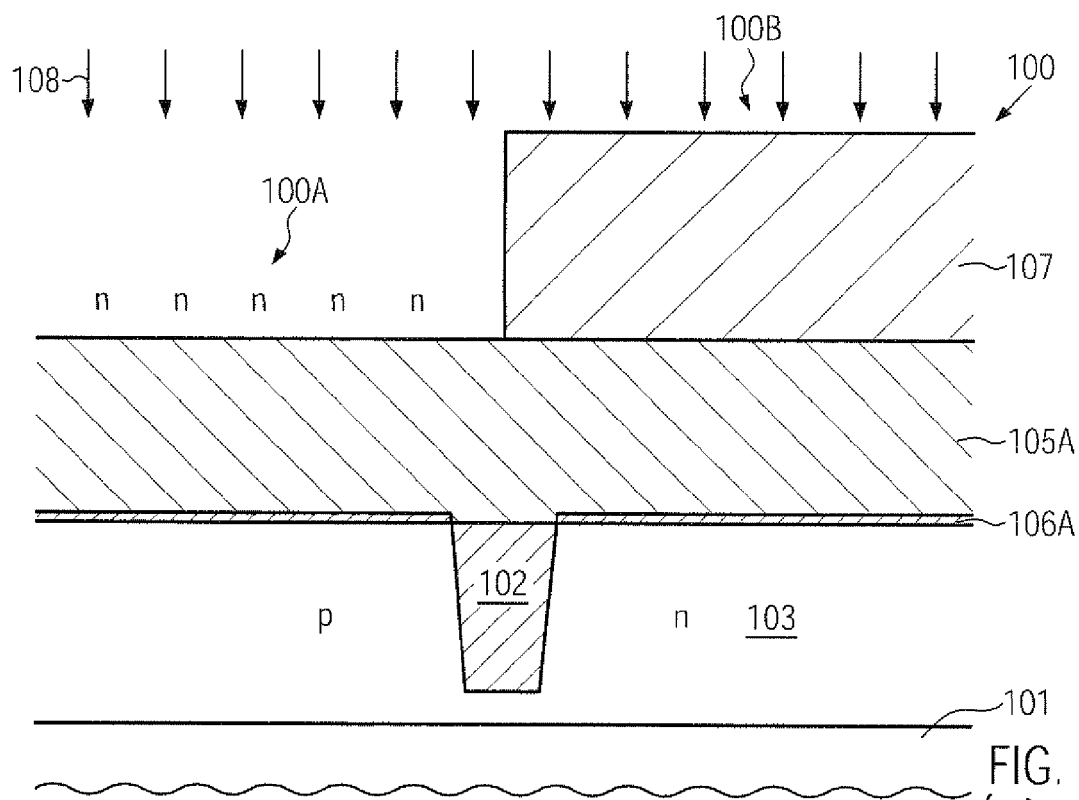
FIGS. 1b-1e schematically illustrate cross-sectional views of the CMOS device during various manufacturing stages in accordance with a conventional process strategy for patterning a gate electrode structure using efficient wet chemical cleaning processes on the basis of APM.
Figure 1C:
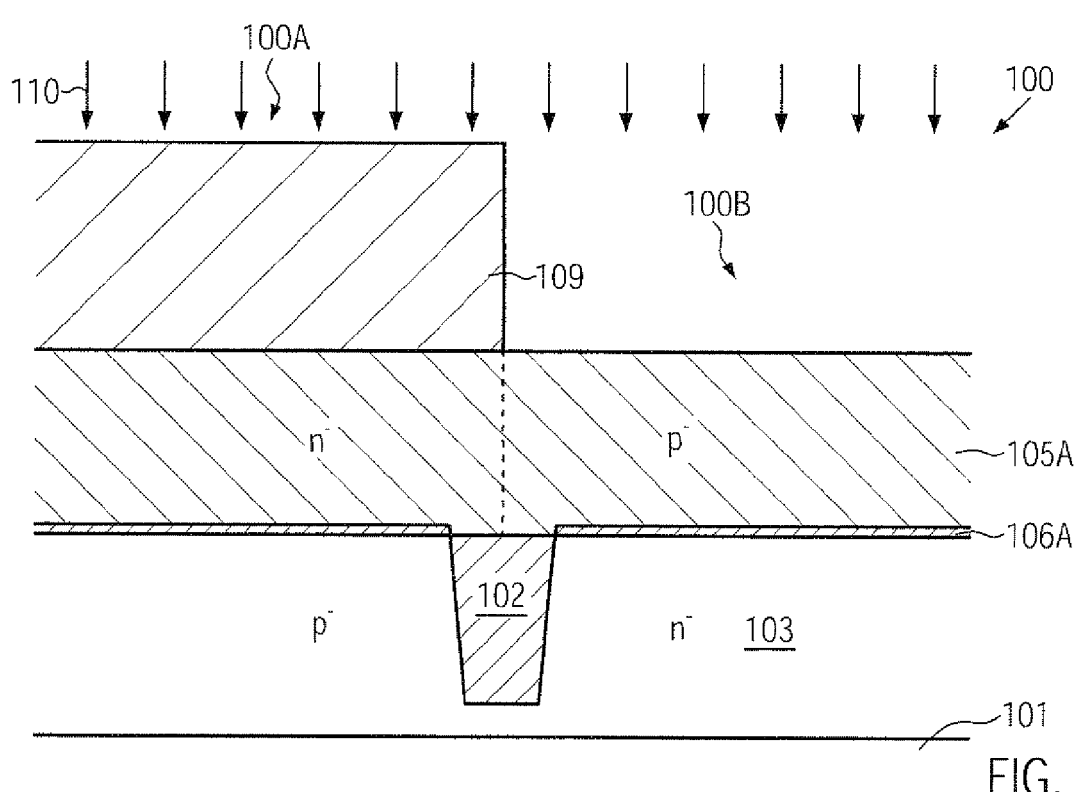
Figures 1D, 1E:
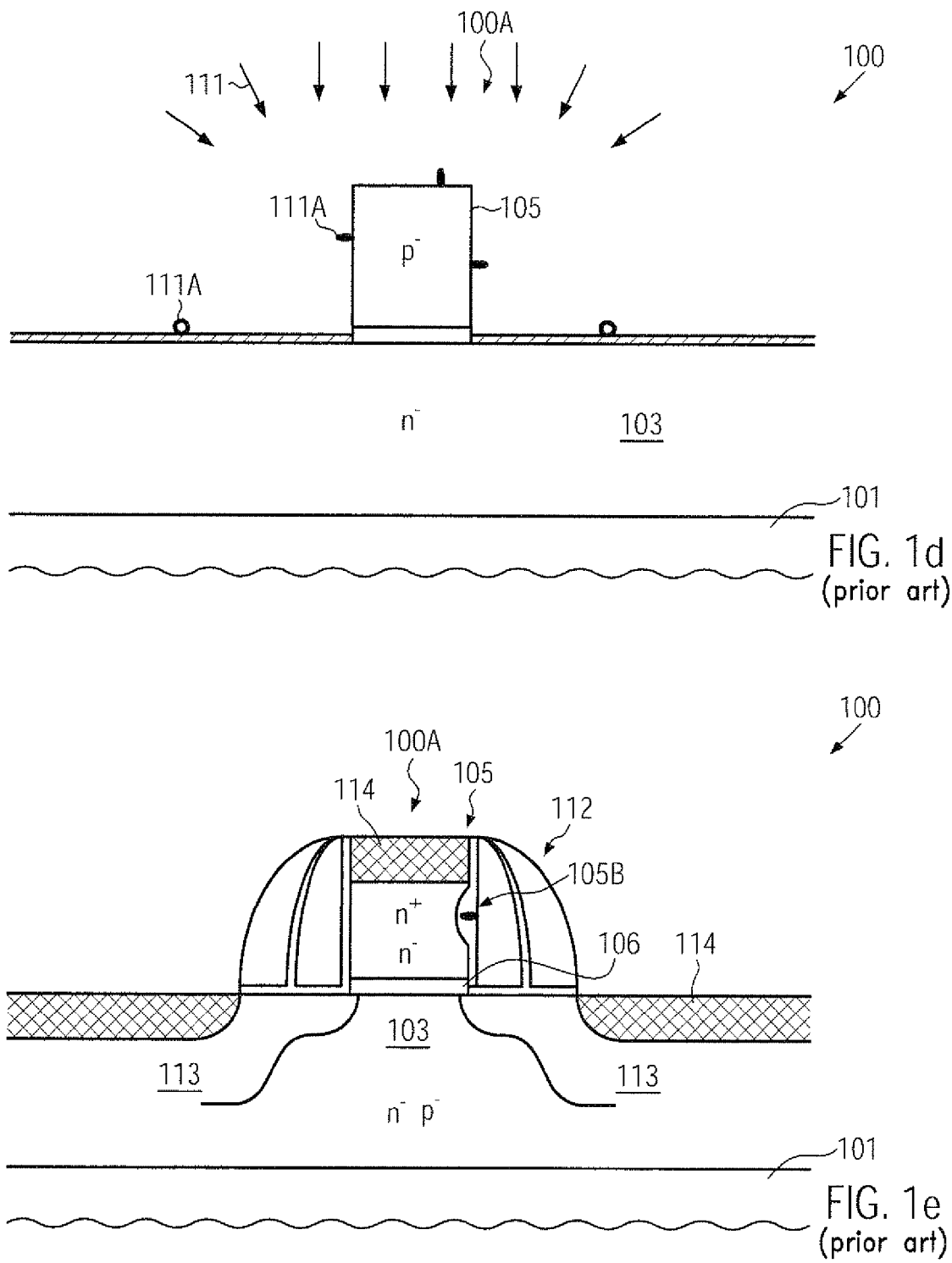

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure provides techniques and CMOS devices in which a modification of the junction region between a P-doped and an N-doped portion of a semiconductor gate electrode material may be modified prior to performing a wet chemical cleaning process in order to reduce yield losses during the further process for completing the basis transistor structure. As previously discussed, it is believed that sensitive wet chemical cleaning processes, for instance based on APM, may have a significant influence on the overall quality of the manufacturing process, in particular with respect to the gate electrode structure, which may result in significant yield loss according to conventional techniques. Without intending to restrict the present disclosure to the following explanation, it is believed that a modification of the parasitic PN junction, for instance by the incorporation of an appropriate inert species, such as nitrogen, xenon, argon and the like, may result in a significantly reduced sensitivity of wet chemical etch recipes with respect to variations of etch rate of a gate electrode material under consideration. For example, it is assumed that a certain degree of "equalization" of electrostatic charges or space charges may significantly reduce the sensitivity of wet chemical cleaning solutions, such as APM, thereby reducing undue etch damages of the gate electrode structure. In other illustrative embodiments disclosed herein, the general configuration of the respective parasitic PN junction may be modified, for instance, by using tilted implantation steps during the incorporation of a desired base doping of the gate electrode material, thereby also reducing the sensitivity of wet chemical cleaning agents with respect to etch rate variations. If desired, a respectively modified parasitic PN junction may additionally be treated with an ion implantation by incorporating an inert species, wherein a reduced dose may be employed, thereby also reducing any effect on the overall characteristics of the gate electrode structure, for instance with respect to conductivity and the like. Thus, the overall production yield may be increased, while not unduly contributing to the overall process complexity, since, in some illustrative embodiments, one additional implantation process may be used which may be performed as a non-masked implantation process, while in other cases a significant modification of the parasitic PN junction may be accomplished without additional process steps.

Figure 2A:
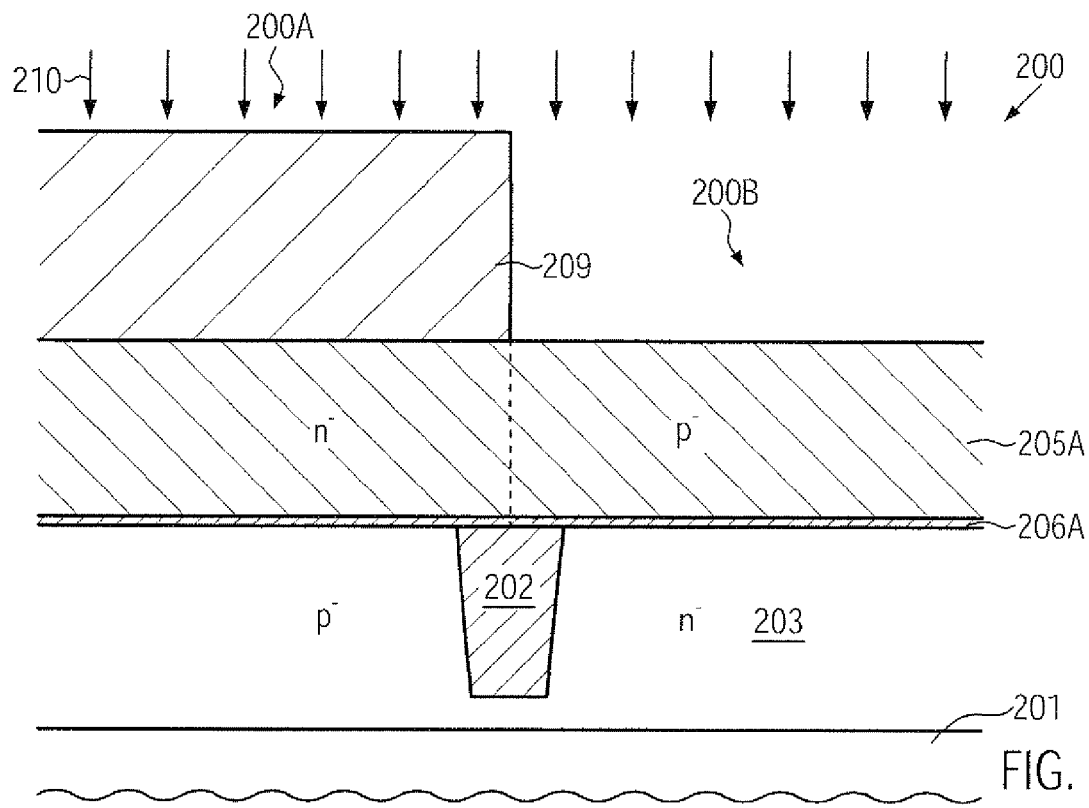
FIGS. 2a-2e schematically illustrate cross-sectional views of a CMOS device during various manufacturing stages prior to actually patterning a gate electrode structure including a sequence for modifying a parasitic PN junction, according to illustrative embodiments.

FIG. 2a schematically illustrates a cross-sectional view of a CMOS device 200 comprising a substrate 201 above which is formed a semiconductor layer 203. The substrate 201 may represent any appropriate carrier material, such as a crystalline semiconductor material, an insulating material and the like, as may be appropriate for forming above the semiconductor layer 203, which may be provided in any suitable configuration, i.e., in the form of a silicon material, silicon/germanium material or any other semiconductor compound. In some illustrative embodiments, the semiconductor layer 203 may represent a silicon-based layer, i.e., a semiconductor material including a significant amount of silicon, possibly in combination with other components, such as germanium, tin and the like, in order to appropriately adjust the desired electrical characteristics, wherein respective components may only be locally provided in the semiconductor layer 203, depending on the overall requirements. It should be appreciated that the layer 203 may be provided in the form of a substantially crystalline material with an appropriate orientation, which may also locally vary depending on the device requirements. In the embodiment shown, the semiconductor layer 203 may represent an upper portion of a substantially crystalline material of the substrate 201, while, in other cases, a buried insulating layer (not shown) may be provided, wherein, however, the buried insulating layer may only be locally formed above the substrate 201, so as to provide a bulk configuration in some device areas while providing an SOI configuration in other areas. Furthermore, a gate insulation layer 206A is formed on the semiconductor layer 203 and, depending on process strategy, also on an isolation structure 202, which may define respective active regions in the semiconductor layer 203, as is also explained above with reference to the device 100. In the example shown, the gate insulation layer 206A may be provided as a substantially continuous layer, which may include any appropriate material, such as an oxide material of the underlying semiconductor material, any other dielectric material, such as silicon nitride, silicon oxynitride, a high-k dielectric material which is to be understood as a dielectric material having a dielectric constant of 10 or higher, such as hafnium oxide, zirconium oxide and the like. In other cases, the layer 206A may comprise a plurality of different materials, for instance, a silicon dioxide material, a silicon nitride material, possibly in combination with a high-k dielectric material. A layer 205A of gate electrode material may be formed on the gate insulation layer 206A with a desired thickness and material composition. For example, the layer 205A may comprise polysilicon, possibly in combination with other semiconductor materials, such as germanium and the like. Moreover, in the manufacturing stage shown, an implantation mask 209 may cover a device region 200A and expose a device region 200B, which may, for convenience, also be referred to as transistors 200A, 200B, since, after patterning the gate electrode layer 205A, respective transistor elements are to be formed in the areas 200A, 200B.

The device 200 as shown in FIG. 2a may be formed on the basis of similar process techniques as previously described with reference to the device 100. For example, prior to or after forming the isolation structure 202, a respective base-doping profile may be defined in the semiconductor layer 203 corresponding to the regions 200A, 200B on the basis of well-established implantation techniques. The isolation structure 202 may be formed, as previously explained, followed by a process sequence for forming the gate insulation layer 206A, which may comprise sophisticated oxidation and/or deposition techniques, depending on the desired material composition of the layer 206A. Thereafter, the layer 205A may be deposited, for instance, by LPCVD, and thereafter an appropriate implantation may be formed to actively introduce an N-type dopant species into the layer 205A corresponding to the region 200A, as is previously explained. After removal of the respective implantation mask, the mask 209 may be formed and an implantation process 210 may be carried out to introduce a P-type dopant species into the exposed portion of the layer 205A.

Figure 2B:
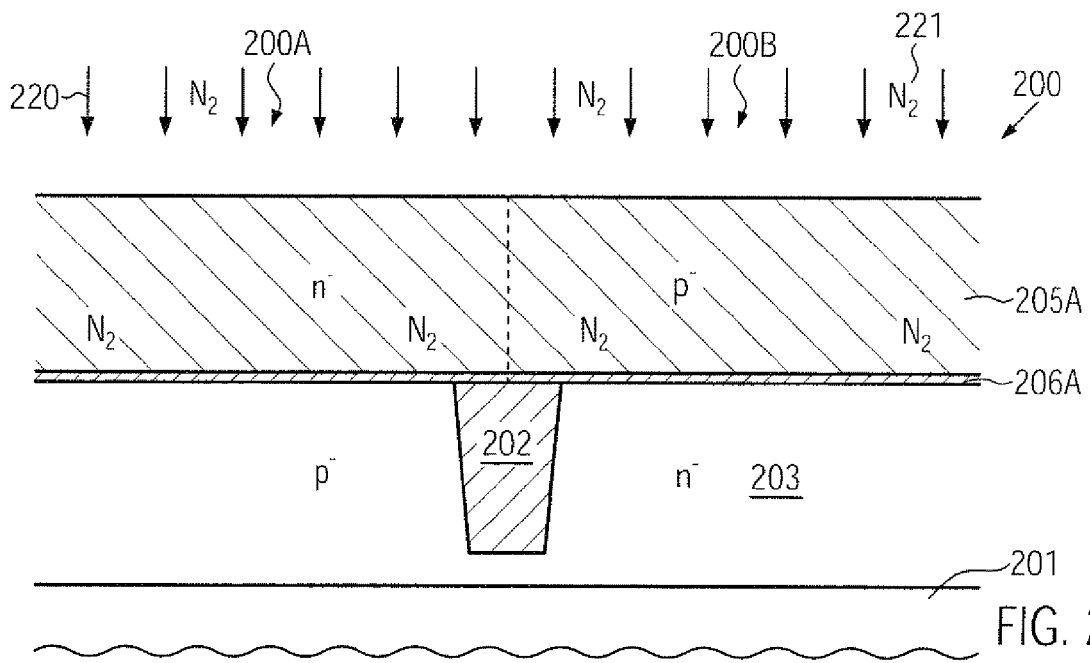

FIG. 2b schematically illustrates the device 200 in an advanced manufacturing stage in which the layer 205A may be exposed to an ion implantation process 220 designed to introduce an inert species, that is, an electrically non-active species, into layer 205A, wherein, in the embodiment shown, the implantation process 220 may be performed as a non-masked implantation process, thereby avoiding any additional lithography steps. During the ion implantation process, the respective process parameters, that is, the implantation energy and the dose, i.e., the ion current and the process time, may be appropriately selected so as to obtain a desired concentration across the layer 205A, without undue penetration of the gate insulation layer 206A and the underlying semiconductor layer 203. To this end, well-established simulation techniques may be used, possibly in combination with performing test runs, in order to establish an appropriate process parameter set. Additionally, appropriate concentration values for the inert species 221 within the layer 205A may be determined by selecting different parameters and monitoring the process results during the further processing of the device 200 in view of etch damages of a gate electrode structure still to be formed. For example, a maximum concentration of the inert species 221, when using nitrogen, may be on the same order of magnitude as the dopant species introduced into the layer 205A so that respective adaptation of the concentration of the species 221 to the concentrations of the N-type dopant species and the P-type dopant species may be achieved. For example, for introducing nitrogen as the inert species 221, implantation energies of several keV to approximately 60 keV for a thickness of the layer 205A in the range of 100-200 nm may be used, thereby creating a maximum concentration within the layer 205A of approximately $10^{19}$ nitrogen atoms per cubic centimeter.

Figure 2C:
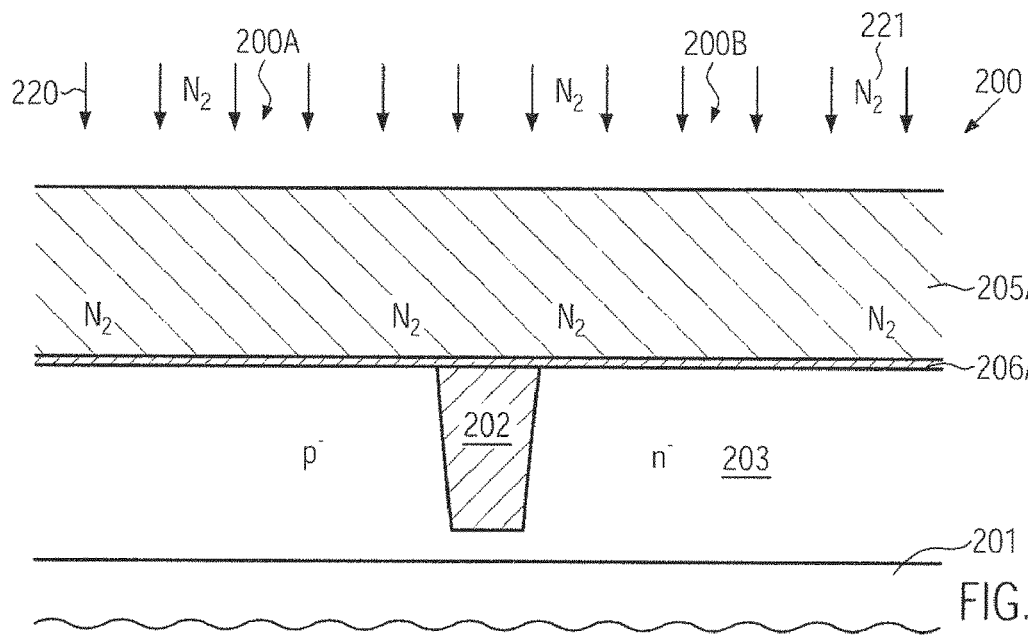

FIG. 2c schematically illustrates the device 200 according to still further illustrative embodiments in which the implantation process 220 may be performed prior to pre-doping gate electrode material 205A. That is, the inert species 221, such as nitrogen and the like, may be incorporated after the deposition of the layer 205A.

Figure 2D:
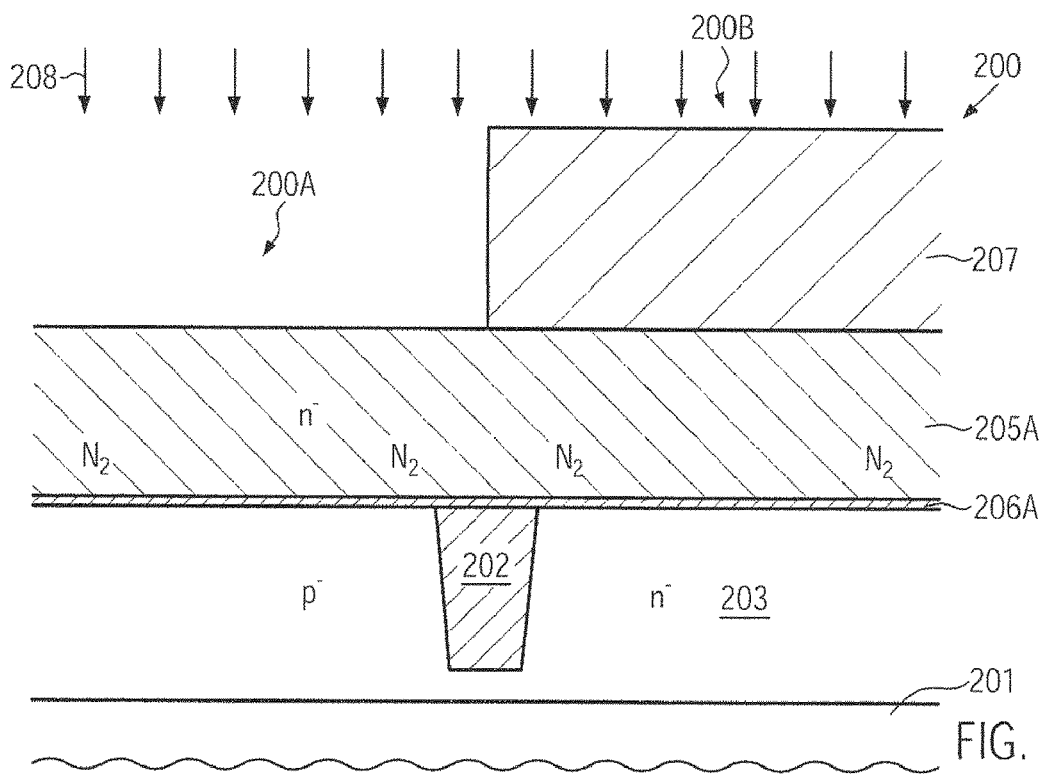

FIG. 2d schematically illustrates the device 200 during an implantation process 208 performed on the basis of an implantation mask 207 that covers the device region 200B while exposing the region 200A for introducing a desired dopant species, which, in embodiments shown, may be an N-type dopant. Thereafter, the respective implantation process may be performed in a similar manner as previously described with reference to FIG. 2a in order to introduce a P-type dopant into the layer 205A.

Figure 2E:
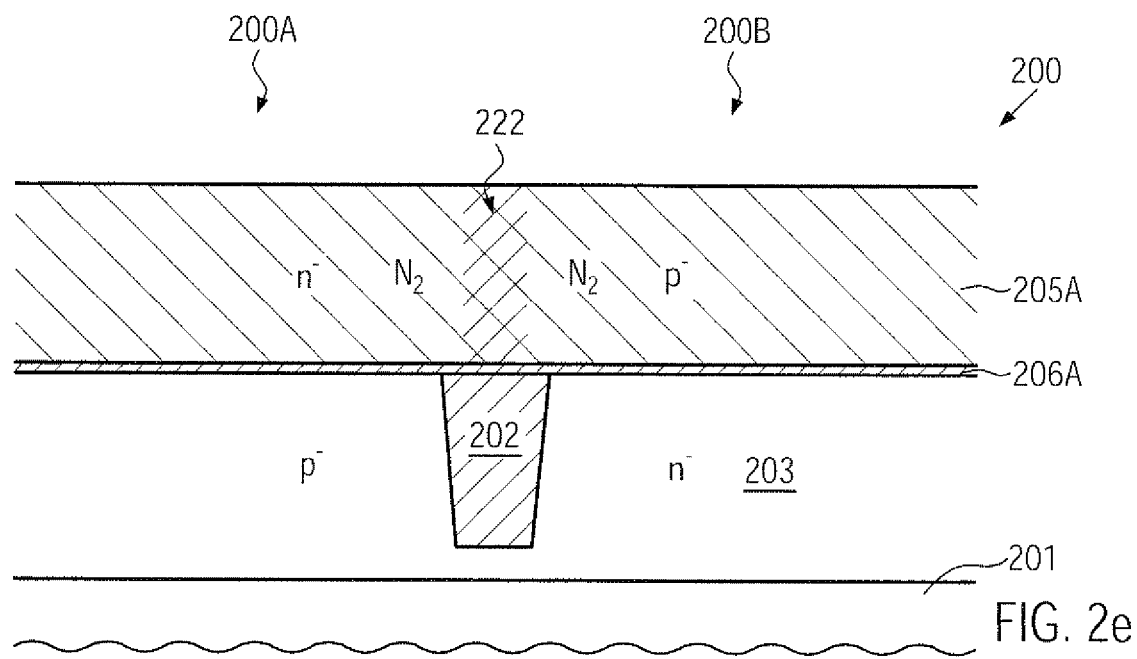

FIG. 2e schematically illustrates the device 200 after the implantation sequence for introducing the desired dopant species and an inert species 221 so that, at a junction region 222, in which the N-type species and the P-type species may form a respective PN interface area, may also include a certain amount of the inert species 221, thereby significantly modifying the overall characteristics with respect to the building up of electrostatic charge in areas adjacent to the junction region 222. Without intending to restrict the present disclosure to any theory, it is believed that the presence of the inert species may halt the electronic characteristics of the junction region 222 of the polycrystalline material of the layer 205A, which, in some illustrative embodiments, may not be annealed at this manufacturing stage so that the presence of the inert species, even in a moderately low concentration, may significantly reduce the capability for charge carrier diffusion and thus the creation of extended electrostatic charges, as may be the case in conventional techniques without modifying the parasitic PN junction.

Figure 2F:
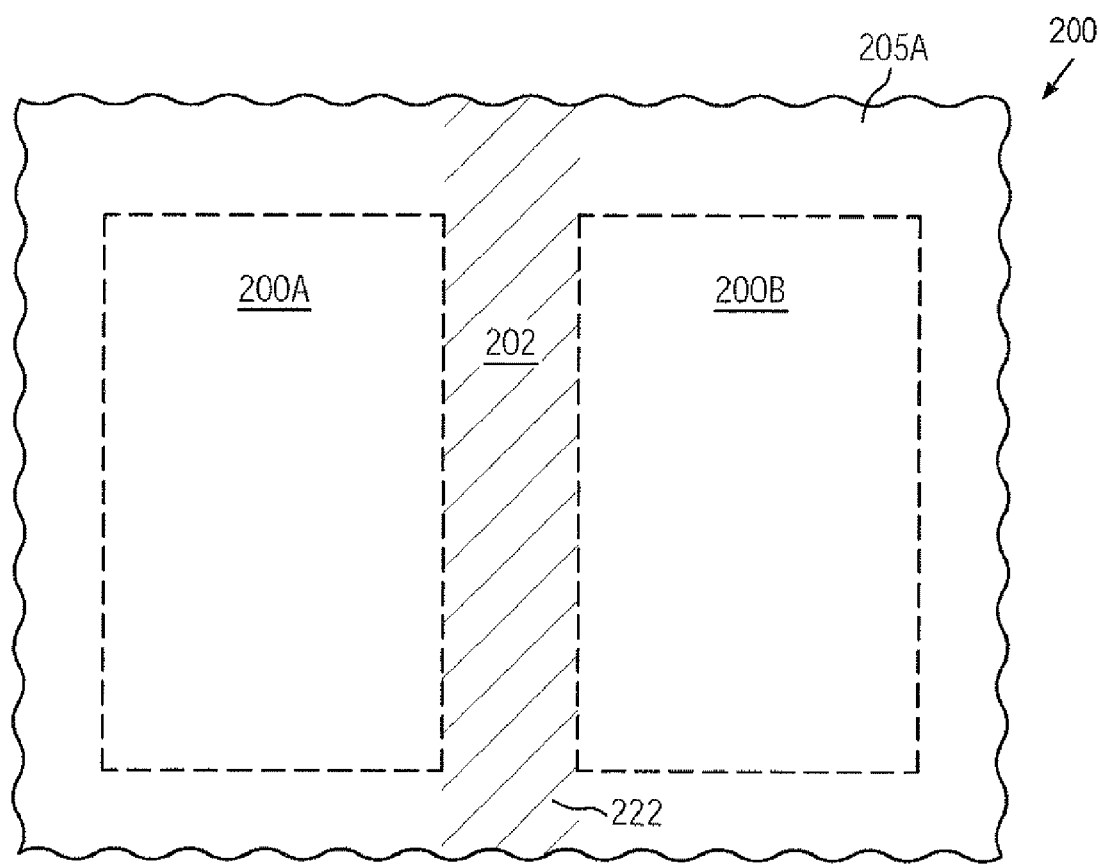
FIGS. 2f-2g schematically illustrate top views of the semiconductor device prior to and after the patterning of gate electrode structures, according to illustrative embodiments.

FIG. 2f schematically illustrates a top view of the device 200 prior to patterning the gate electrode layer 205A. As illustrated, the regions 200A, 200B are separated by the isolation structure 202, above which is substantially positioned the junction region 222 including the modified PN junction. In this stage, an appropriate patterning sequence may be performed on the basis of well-established techniques, as previously described, in order to form gate electrode structures for the transistors 200A, 200B, which may be connected across the isolation structure 202.

Figure 2G:
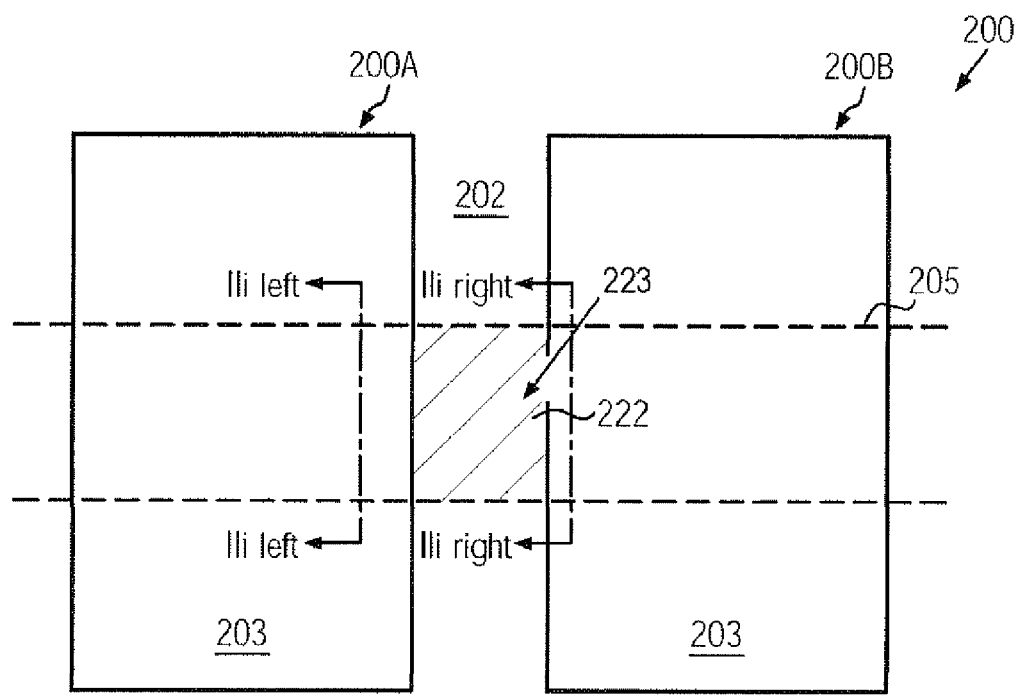

FIG. 2g schematically illustrates the device 200 with a gate electrode 205 formed above the regions 200A, 200B and the isolation structure 202. Furthermore, a critical area 223 centered around the junction region 222 may exhibit a reduced electrostatic charge due to the modified PN junction, as previously explained.

FIG. 2h schematically illustrates a cross-sectional view as indicated by the lines IIi left, IIi right as shown in FIG. 2g. That is, the gate electrode 205 is shown in cross-sectional view on the left-hand side for the transistor 200A and on the right-hand side for the transistor 200B. As previously explained, after the complex patterning sequence, including a plurality of etch processes, the device 200 may be subjected to a wet chemical cleaning process 211, for instance on the basis of APM, in order to remove organic contaminants, particles and the like. During the process 211, an increased etch rate variability of the wet chemical cleaning agent may be reduced due to the previously performed modification of the gate electrode material 205A, which is believed to cause a corresponding modification of the PN junction in the region 222, thereby also reducing or substantially equalizing electrostatic charges in the critical region 223. Consequently, the cleaning process 211 may be performed on the basis of well-established and highly efficient recipes while significantly reducing any unwanted undue etch damages of the exposed gate electrodes 205. Thereafter, the further processing may be continued on the basis of well-established process techniques, that is, drain and source regions may be formed in the semiconductor layer 203 by using appropriately dimensioned spacer structures in combination with anneal cycles. It should also be appreciated that, in some illustrative embodiments, an anneal process may be performed after the cleaning process 211 in order to activate the dopants in the gate electrodes 205, which may also result in a certain degree of "re-establishment" of a PN junction in the region 222, which, however, may not negatively affect the further processing after performing the critical cleaning process 211. In other cases, a respective anneal process may be omitted and the dopants in the gate electrodes 205 may be activated during respective anneal processes for activating the drain and source regions in a later manufacturing stage.

FIG. 2i schematically illustrates the device 200 in a further advanced manufacturing stage when the basic structure of the transistors 200A, 200B is completed. That is, each of the transistors 200A, 200B may comprise the gate electrode 205, wherein the gate electrode 205 of the transistor 200A may comprise an N-doped portion 205N, when the transistor 200A represents an N-channel transistor, while the gate electrode 205 of the transistor 200B may comprise a P-doped portion 205P. Moreover, in the portions 205N, 205P, the inert species 221 may be present in a concentration and the respective concentration profile that is approximately equal to both transistors 200A, 200B when the gate electrodes 205 are formed on the basis of the same basic material, since, in this case, substantially the same diffusion behavior may be obtained for the inert species 221. In other cases, the concentration profile may differ, while, however, the concentration may be approximately the same due to a common implantation process for incorporating the inert species 221. Moreover, the gate electrodes 205 may each comprise a metal silicide region 214 when the gate electrodes 205 comprise a significant amount of silicon material. Also, in this case, the metal silicide regions 214 may have substantially the same concentration with respect to the inert species 221 due to the previous implantation process. Furthermore, each of the transistors may comprise a respective sidewall spacer structure 212 and drain and source regions 213, which enclose a respective channel region 215. Furthermore, metal silicide regions 214 may also be provided in the drain and source regions 213. The transistors 200A, 200B as shown in FIG. 2i may be formed on the basis of well-established process techniques including the deposition of appropriate spacer materials in combination with etch stop material, the patterning of these materials for forming individual spacer elements of the structure 212, which may then be used as an implantation mask in combination with the gate electrodes 205 in order to obtain the desired vertical and lateral dopant profile for the drain and source regions 213. Thereafter, the device 200 may be annealed, thereby activating the dopant in the gate electrodes 205 and the drain and source regions 213, while also recrystallizing damaged structures in the semiconductor layer 203. Thereafter, the metal silicide regions 214 may be formed, for instance, by depositing a refractory metal and initiating a chemical reaction with the underlying silicon material, wherein a certain amount of inert species may also be present, as previously explained. Thus, by providing the inert species 221, such as nitrogen, undue etch attack of the gate electrodes 205 may be significantly suppressed, thereby increasing process yield.

Figure 3A:
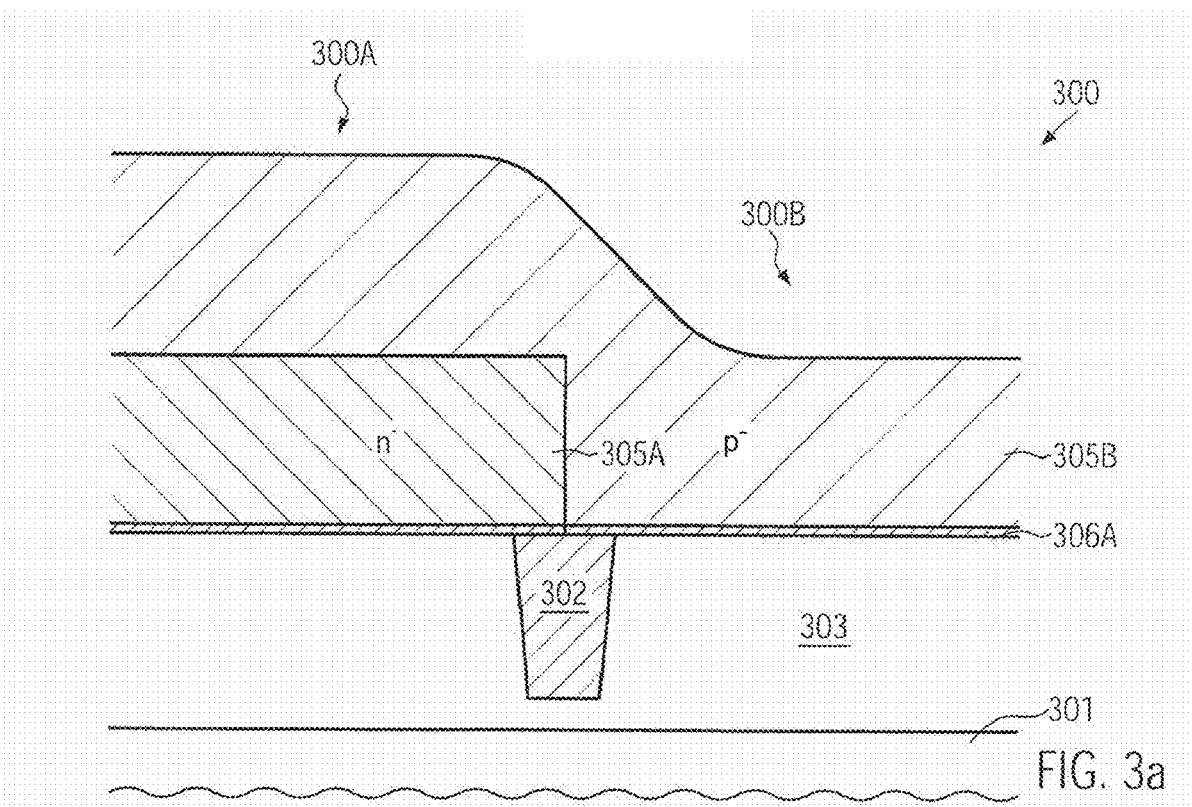
FIGS. 3a-3b schematically illustrate cross-sectional views of a CMOS device during various manufacturing stages in forming a gate electrode material and modifying parasitic PN junctions thereof, according to still further illustrative embodiments.
Figure 3B:
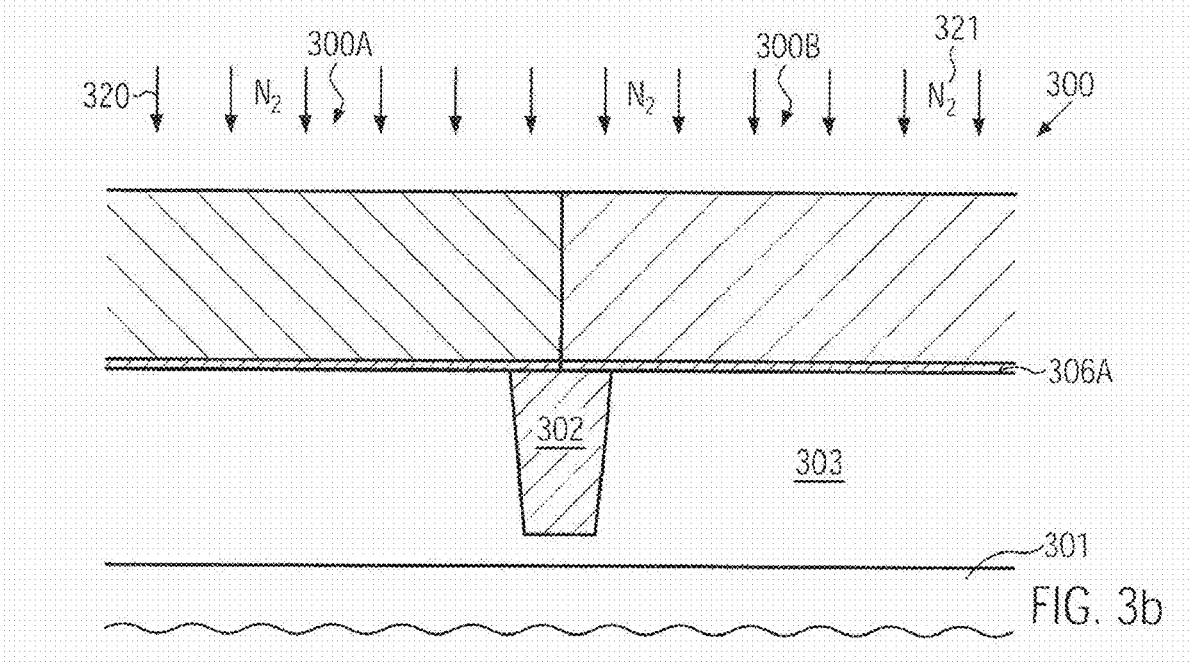

With reference to FIGS. 3a-3b, further illustrative embodiments will now be described in which the gate electrode material may be formed by selectively depositing gate electrode material including an appropriate dopant species.

FIG. 3a schematically illustrates a cross-sectional view of a semiconductor device 300 comprising a substrate 301, a semiconductor layer 303, in which an isolation structure 302 separates a region 300A from a region 300B. Moreover, a gate insulation layer 306A may be formed on the layer 303. For the components described so far, the same criteria apply as previously explained with reference to the devices 100 and 200. Furthermore, the first gate electrode material 305A is formed above the layer 303 corresponding to the region 300A and may include an appropriate dopant species as required for the transistor to be formed in the region 300A. Moreover, a second gate electrode material 305B may be formed above the layer 305A and on the exposed portion of the gate insulation layer 306A. The second gate electrode material 305B may comprise a respective dopant species, as desired. The device 300 as shown in FIG. 3a may be formed on the basis of the following processes. The isolation structure 302 and the gate insulation layer 306A may be formed on the basis of process techniques as previously described. Thereafter, the first gate electrode material 305A may be deposited, for instance, by LPCVD, wherein an appropriate dopant species may be incorporated into the deposition ambient at any appropriate stage of the deposition process in order to obtain a desired dopant concentration and vertical dopant profile. Thereafter, a lithography mask may be formed and an unwanted portion of the layer 305A may be removed by appropriate etch techniques, wherein, in a final phase, a highly selective wet chemical etch step may be used to reduce unwanted damage of the gate insulation layer 306A. Thereafter, the second layer 305B may be deposited, while also incorporating an appropriate dopant species into the deposition ambient at a desired stage of the deposition process to establish the desired concentration and profile. Thereafter, excess material of the layer 305B may be removed, for instance, by CMP, thereby also creating a substantially planar surface topography.

FIG. 3b schematically illustrates the device 300 during an ion implantation process 320 in order to introduce an inert species 321, such as nitrogen. In other cases, other appropriate species, such as xenon, argon and the like, may be used. With respect to any process parameters of the implantation process 320, the same criteria apply as previously explained with reference to the implantation process 220. Thereafter, the further processing may be continued as described above in order to pattern the layers 305A, 305B to form respective gate electrodes and performing a cleaning process on the basis of efficient wet chemical agents, as previously described.

Figure 4A:
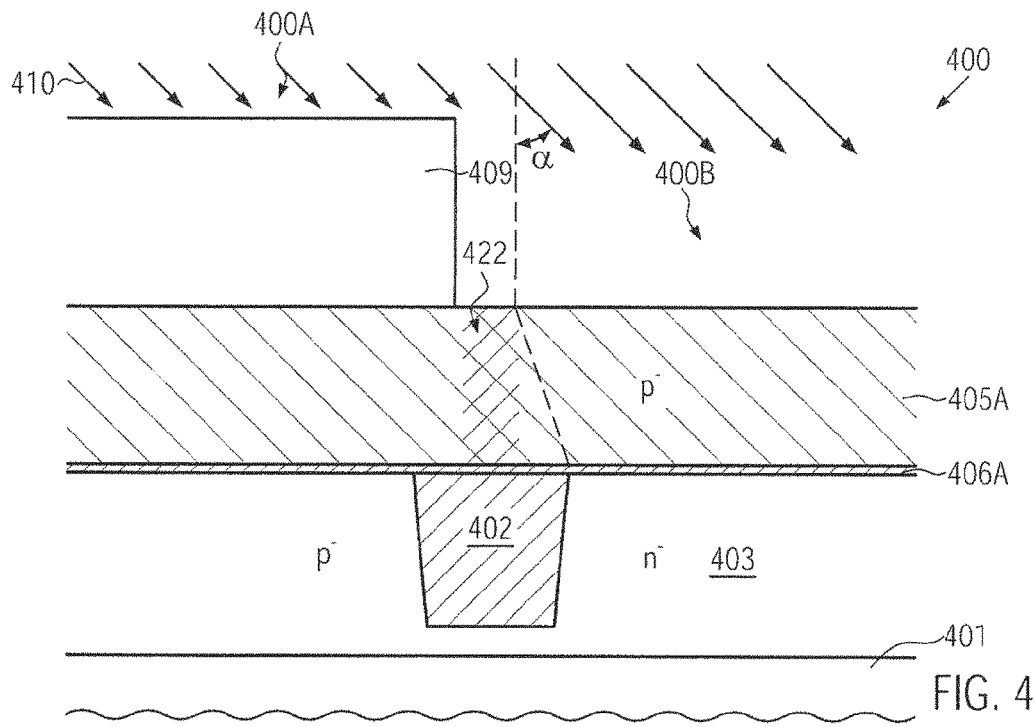
FIGS. 4a-4c schematically illustrate cross-sectional views of a CMOS device during various manufacturing stages in forming a gate electrode material including different types of dopant and a modified PN junction, according to still further illustrative embodiments.
Figure 4B:
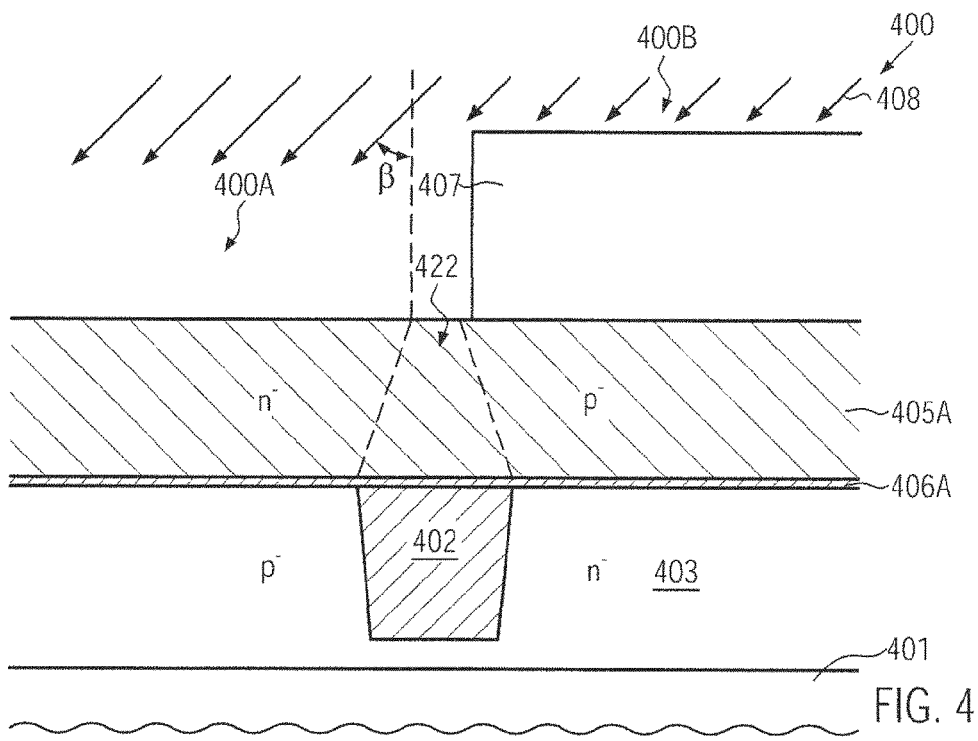
Figure 4C:
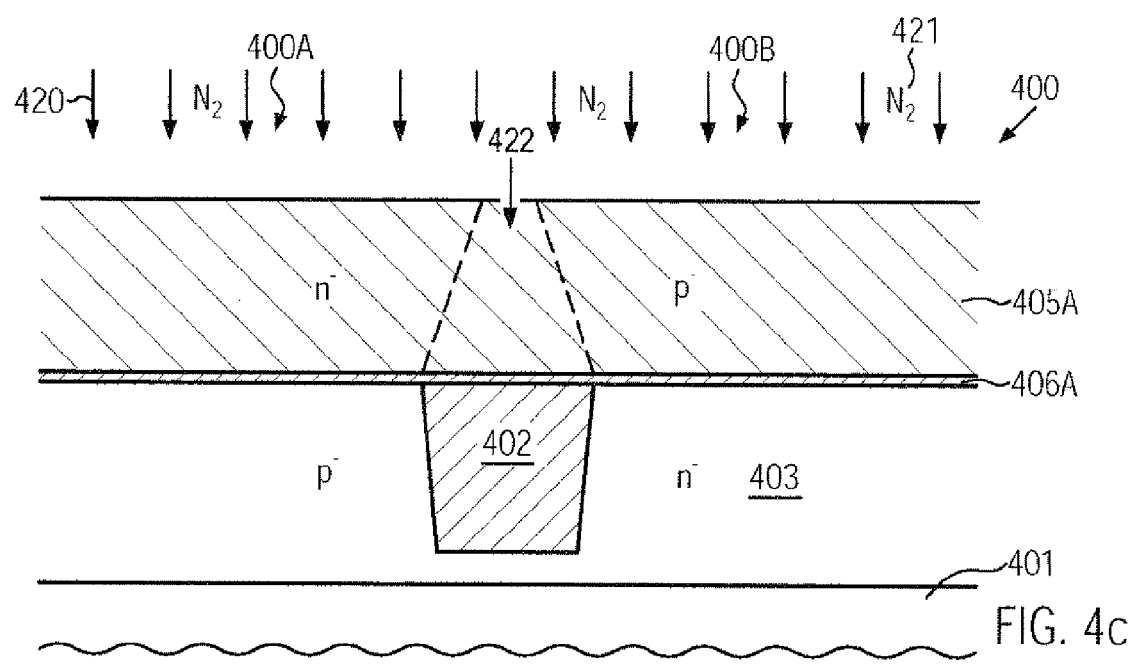

With reference to FIGS. 4a-4c, further illustrative embodiments will now be described in which a modification of a parasitic PN junction may be accomplished by performing tilted implantation processes.

FIG. 4a schematically illustrates a device 400 comprising a substrate 401, a semiconductor layer 403, a gate insulation layer 406A and a gate electrode material 405A. With respect to these components, the same criteria apply as previously explained, for instance, with respect to the devices 100 and 200. Furthermore, in the manufacturing stage shown, an implantation mask 409 may be formed so as to cover a region 400A while exposing a region 400B. In the embodiment shown, the gate electrode material 405A may be provided as a substantially non-doped polysilicon material, wherein an appropriate dopant species may be introduced into the region 400B during the implantation process 410, which may be performed on the basis of a tilt angle α, which is to be understood as an angle between a substantially perpendicular direction and the direction of an ion beam of the implantation process 410. The tilt angle α is selected such that the implantation mask 409 may have a shadowing effect for a portion of the exposed region 400B, thereby maintaining a substantially non-doped area 422, or the area 422 may have a significantly reduced dopant concentration compared to the non-shadowed area of the layer 405A. It should be appreciated that the corresponding implantation parameters of the process 410 may be adapted to the tilt angle α so as to take into consideration the "increased" thickness of the layer 405A when seen from the ion beam, thereby requiring increased implantation energy.

FIG. 4b schematically illustrates the device 400 in a further advanced manufacturing stage in which an implantation mask 407 covers the region 400B, while the region 400A is exposed to a further tilted implantation process 408 with a negative tilt angle, when the tilt angle α as shown in FIG. 4a may be considered as a positive tilt angle. That is, the mask 407 may have a shadowing effect for the region 422 or at least a portion thereof so that, in general, an area of a significantly reduced dopant concentration or an intrinsic area may be obtained above the isolation structure 402. Consequently, a respective "PN" junction between the areas 400A, 400B may be significantly modified compared to conventional parasitic PN junctions, thereby also reducing the effect during a corresponding sensitive wet chemical cleaning process. Thus, after removing the etch mask 407, the further processing may be continued by patterning the gate electrode material 405A on the basis of process strategies as previously explained, followed by an efficient cleaning process in which undue etch damage may be significantly reduced. In this case, additional process steps compared to the conventional strategy may be avoided.

FIG. 4c schematically illustrates the device 400 according to further illustrative embodiments in which, prior to or after the sequence of tilted implantation processes 410 and 408, a further implantation process may be performed for introducing an inert species 421, such as nitrogen, in order to further modify the respective junction region 422. During the implantation process 420, a reduced dose may be employed, since the very weak "PN junction" between the regions 400A, 400B may be efficiently modified on the basis of a significantly reduced amount of inert species. Hence, the "efficiency" of the inert species 421 may be increased, since a reduced concentration results in an efficient modification of the critical area 422. Thereafter, the further processing may be continued, as previously described.

As a result, the present disclosure provides semiconductor devices and methods for forming the same in which yield losses of conventional process techniques for forming complex CMOS devices may be reduced by providing an inert species in the gate electrode material prior to performing a wet chemical cleaning process, thereby providing enhanced process stability in view of etch rate of the cleaning agent, which may directly translate into reduced etch damage of the gate electrode structures.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method of forming a CMOS device, the method comprising:
    forming a gate electrode material on a gate insulation layer;
    forming a first mask above said gate electrode material, said first mask covering a first portion of said gate electrode material and exposing a second portion of said gate electrode material;
    performing a first tilted implantation process to form an N-doped region in said second portion of said gate electrode material, wherein said first mask reduces N-type dopant penetration into a junction region of said gate electrode material between said first and second portions during said first tilted implantation process;
    forming a second mask above said gate electrode material, said second mask covering said second portion and exposing said first portion;
    performing a second tilted implantation process to form a P-doped region in said first portion of said gate electrode material, wherein said second mask reduces P-type dopant penetration into said junction region during said second tilted implantation process;
    forming a first gate electrode from said N-doped region;
    forming second gate electrode from said P-doped region; and
    performing a wet chemical cleaning process on said first and second gate electrodes.

2. The method of claim 1, wherein performing said wet chemical cleaning process comprises using a mixture comprised of ammonia ($NH_3$) and hydrogen peroxide ($H_2O_2$).

3. The method of claim 1, further comprising introducing an inert species into said junction region.

4. The method of claim 3, wherein introducing said inert species comprises introducing at least one of xenon, argon and nitrogen.

5. The method of claim 3, wherein introducing said inert species in said junction region comprises performing a non-masked implantation process.

6. The method of claim 3, wherein introducing said inert species in said junction region comprises forming an implantation mask to cover at least a portion of said N-doped region and said P-doped region and to expose at least a portion of said junction region, and implanting said inert species into the exposed portion of said junction region.

7. The method of claim 3, wherein said inert species is introduced after forming said N-doped region and said P-doped region.

8. The method of claim 3, wherein said inert species is introduced prior to forming said N-doped region and said P-doped region.

9. The method of claim 8, wherein said inert species is introduced when forming said gate electrode material.

* * * * *